(12) United States Patent
Kanada et al.

(10) Patent No.: US 11,189,865 B2
(45) Date of Patent: Nov. 30, 2021

(54) DETERIORATION ESTIMATION DEVICE FOR SECONDARY BATTERY, AND DETERIORATION ESTIMATION METHOD FOR SECONDARY BATTERY

(71) Applicant: TOYOTA JIDOSHA KABUSHIKI KAISHA, Toyota (JP)

(72) Inventors: Ryo Kanada, Toyota (JP); Hiroki Nagai, Aichi-ken (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 217 days.

(21) Appl. No.: 16/672,990

(22) Filed: Nov. 4, 2019

(65) Prior Publication Data
US 2020/0185789 A1    Jun. 11, 2020

(30) Foreign Application Priority Data

Dec. 7, 2018   (JP) .............................. JP2018-229691

(51) Int. Cl.
| | | |
|---|---|---|
| *H02J 7/14* | (2006.01) | |
| *H01M 10/44* | (2006.01) | |
| *H01M 10/0525* | (2010.01) | |
| *G01R 31/382* | (2019.01) | |

(52) U.S. Cl.
CPC ........ *H01M 10/443* (2013.01); *G01R 31/382* (2019.01); *H01M 10/0525* (2013.01)

(58) Field of Classification Search
USPC .................... 320/130, 131, 132, 133, 134
See application file for complete search history.

(56) References Cited

U.S. PATENT DOCUMENTS

| | | | | |
|---|---|---|---|---|
| 8,035,395 B2 * | 10/2011 | Suzuki | ................. | G01R 31/392 |
| | | | | 324/427 |
| 2008/0234956 A1 * | 9/2008 | Mizuno | ................ | G01R 31/367 |
| | | | | 702/63 |
| 2011/0121786 A1 | 5/2011 | Tsuruta et al. | | |

FOREIGN PATENT DOCUMENTS

| | | | | |
|---|---|---|---|---|
| CN | 103713263 B | * | 8/2016 | ............ H01M 10/48 |
| JP | H08136629 A | * | 5/1996 | |
| JP | 2003197275 A | * | 7/2003 | ............ H01M 10/48 |
| JP | 2011-113688 A | | 6/2011 | |
| JP | 2013019852 A | * | 1/2013 | |
| JP | 2015056354 A | * | 3/2015 | |
| JP | 2015094710 A | * | 5/2015 | |
| JP | 2016173281 A | * | 9/2016 | |

* cited by examiner

*Primary Examiner* — Brian Ngo
(74) *Attorney, Agent, or Firm* — Sughrue Mion, PLLC (57) ABSTRACT

A controller of a deterioration estimation device for a secondary battery is configured to acquire a first open circuit voltage when a temperature of the secondary battery is a first temperature and a second open circuit voltage when the temperature of the secondary battery is a second temperature changed from the first temperature, and estimate a degree of deterioration of the secondary battery by using a difference between first and second slopes. The first slope is a ratio of a voltage change obtained by subtracting the first open circuit voltage from the second open circuit voltage to a temperature change obtained by subtracting the first temperature from the second temperature. The second slope is a ratio of the voltage change to the temperature change when the temperature of the new secondary battery has changed from the first temperature to the second temperature.

3 Claims, 7 Drawing Sheets

DETERIORATION ESTIMATION DEVICE FOR SECONDARY BATTERY, AND DETERIORATION ESTIMATION METHOD FOR SECONDARY BATTERY

INCORPORATION BY REFERENCE

The disclosure of Japanese Patent Application No. 2018-229691 filed on Dec. 7, 2018 including the specification, drawings and abstract is incorporated herein by reference in its entirety.

BACKGROUND

1. Technical Field

The disclosure relates to a deterioration estimation device for a secondary battery and a deterioration estimation method for a secondary battery.

2. Description of Related Art

A technique for determining a state of deterioration of a secondary battery is publicly known. For example, Japanese Unexamined Patent Application Publication No. 2011-113688 (JP 2011-113688 A) describes a technique for determining the state of deterioration of a secondary battery based on the slope of an entropy curve relative to a charge depth.

SUMMARY

However, in JP 2011-113688 A, a secondary battery needs to be charged and discharged in a predetermined condition before measurement of an entropy change, so the preparation of an environment that allows charging and discharging of a secondary battery is required to determine the state of deterioration of the secondary battery. For this reason, when there is no environment that allows charging and discharging of a secondary battery, the state of deterioration of the secondary battery cannot be determined, so the degree of deterioration of the secondary battery may not be accurately estimated. In addition, when a secondary battery is charged and discharged for the purpose of determining the state of deterioration of the secondary battery, an energy loss may occur.

The disclosure provides a deterioration estimation device for a secondary battery and a deterioration estimation method for a secondary battery, which accurately estimate the degree of deterioration of a secondary battery without charging or discharging of the secondary battery.

A deterioration estimation device for a secondary battery according to an aspect of the disclosure includes a controller. The controller is configured to acquire a first open circuit voltage of the secondary battery when a temperature of the secondary battery is a first temperature and a second open circuit voltage of the secondary battery when the temperature of the secondary battery is a second temperature to which the temperature of the secondary battery has changed from the first temperature. The controller is further configured to estimate a degree of deterioration of the secondary battery by using a difference between a first slope and a second slope. The first slope is represented by a ratio of a voltage change obtained by subtracting the first open circuit voltage from the second open circuit voltage to a temperature change obtained by subtracting the first temperature from the second temperature. The second slope is represented by a ratio of the voltage change to the temperature change when the secondary battery is new and the temperature of the secondary battery has changed from the first temperature to the second temperature.

With this configuration, the difference between the first slope and the second slope corresponds to the amount of deviation from an initial value of the capacity, so the degree of deterioration of the secondary battery is accurately estimated by using the calculated difference. Therefore, even when there is no environment that allows charging and discharging of the secondary battery, the degree of deterioration of the secondary battery is accurately estimated.

The deterioration estimation device may further include a temperature adjuster configured to adjust the temperature of the secondary battery. The controller may be configured to, when the temperature of the secondary battery is adjusted to at least one of the first temperature and the second temperature by using the temperature adjuster, acquire an open circuit voltage corresponding to the adjusted temperature.

With this configuration, the temperature of the secondary battery can be adjusted to at least one of the first temperature and the second temperature by using the temperature adjuster, and at least any one of the first open circuit voltage and the second open circuit voltage can be acquired. Therefore, in comparison with the case where the second open circuit voltage at the second temperature to which the temperature of the secondary battery has changed from the first temperature as a result of, for example, left standing is acquired, the first open circuit voltage and the second open circuit voltage are quickly acquired.

A deterioration estimation method for a secondary battery according to another aspect of the disclosure includes acquiring a first open circuit voltage of the secondary battery when a temperature of the secondary battery is a first temperature and a second open circuit voltage of the secondary battery when the temperature of the secondary battery is a second temperature to which the temperature of the secondary battery has changed from the first temperature, and estimating a degree of deterioration of the secondary battery by using a difference between a first slope and a second slope. The first slope is represented by a ratio of a voltage change obtained by subtracting the first open circuit voltage from the second open circuit voltage to a temperature change obtained by subtracting the first temperature from the second temperature. The second slope is represented by a ratio of the voltage change to the temperature change when the secondary battery is new and the temperature of the secondary battery has changed from the first temperature to the second temperature.

According to the disclosure, a deterioration estimation device for a secondary battery and a deterioration estimation method for a secondary battery, which accurately estimate a degree of deterioration of the secondary battery without charging or discharging of the secondary battery, are provided.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Hereinafter, an embodiment of the disclosure will be described in detail with reference to the accompanying drawings. Like reference signs denote the same or corresponding portions in the drawings, and the description thereof will not be repeated.

Hereinafter, the case where a vehicle is equipped with a deterioration estimation device for a secondary battery according to the embodiment of the disclosure will be described as an example.

Figure 1:
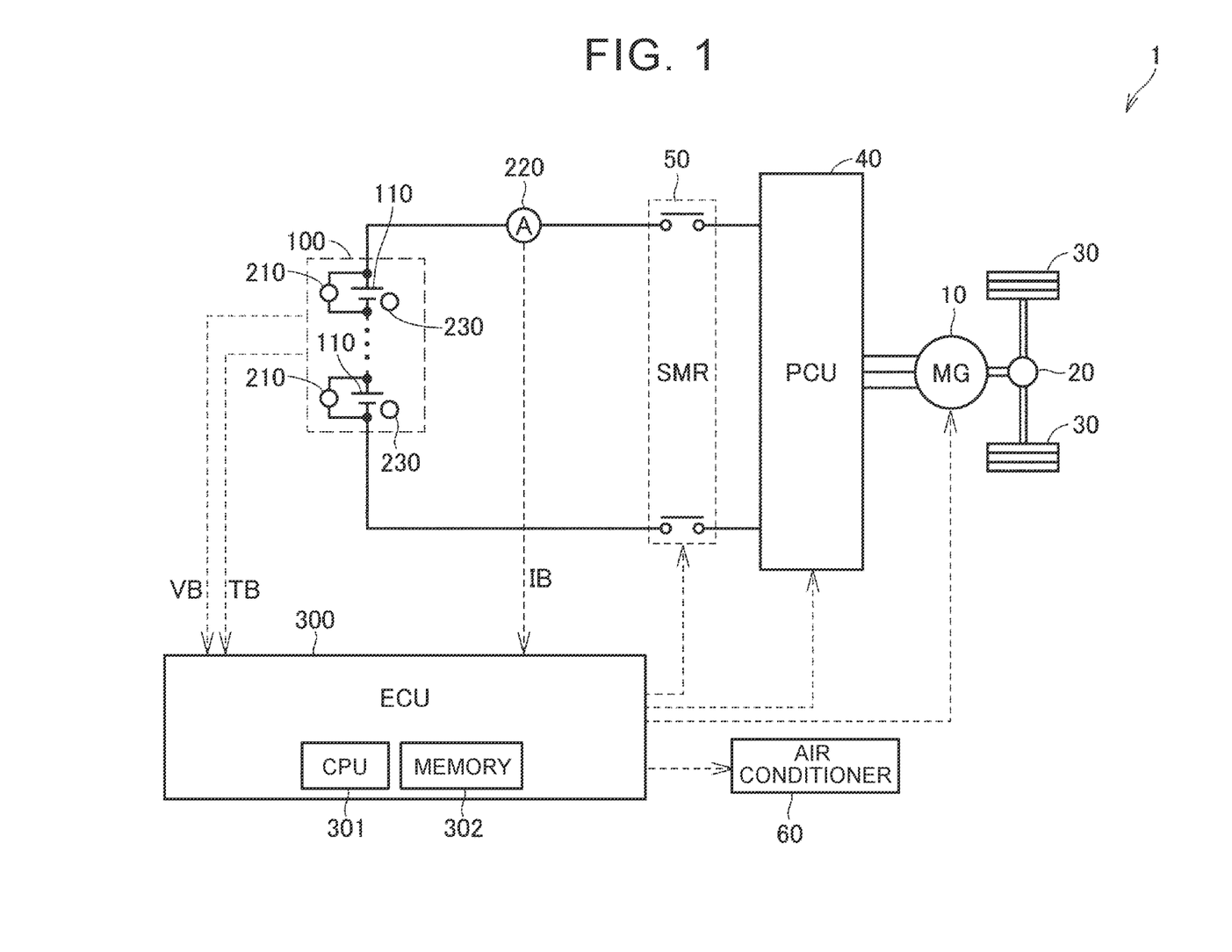
FIG. 1 is a diagram that shows an example of the configuration of a vehicle equipped with a deterioration estimation device for a secondary battery according to an embodiment.

FIG. 1 is a diagram that shows an example of the configuration of a vehicle 1 equipped with the deterioration estimation device for a secondary battery according to the embodiment. In the present embodiment, the vehicle 1 is, for example, an electric vehicle. The vehicle 1 includes a motor generator (MG) 10, a power transmission gear 20, drive wheels 30, a power control unit (PCU) 40, a system main relay (SMR) 50, an air conditioner 60, a battery 100, voltage sensors 210, a current sensor 220, temperature sensors 230, and an electronic control unit (ECU) 300.

The MG 10 is, for example, a three-phase alternating-current rotary electric machine. The MG 10 has the function of an electric motor (motor) and the function of a generator. Torque output from the MG 10 is transmitted to the drive wheels 30 via the power transmission gear 20. The power transmission gear 20 includes a speed reducer, a differential gear unit, and other components.

When the vehicle 1 brakes, the MG 10 is driven by the drive wheels 30, and the MG 10 operates as a generator. Thus, the MG 10 also functions as a braking device that performs regenerative braking for converting the kinetic energy of the vehicle 1 to electric power. Regenerated electric power generated by regenerative braking force in the MG 10 is stored in the battery 100.

The PCU 40 is a power conversion device that bidirectionally converts electric power between the MG 10 and the battery 100. The PCU 40 includes, for example, an inverter and a converter that operate based on a control signal from the ECU 300.

When the battery 100 is discharged, the converter steps up voltage supplied from the battery 100 and supplies the stepped-up voltage to the inverter. The inverter converts direct-current power supplied from the converter to alternating-current power and drives the MG 10.

On the other hand, when the battery 100 is charged, the inverter converts alternating-current power generated by the MG 10 to direct-current power and supplies the direct-current power to the converter. The converter steps down voltage supplied from the inverter to voltage suitable for charging the battery 100 and supplies the stepped-down voltage to the battery 100.

The PCU 40 suspends charging or discharging by stopping the operations of the inverter and converter based on a control signal from the ECU 300. The PCU 40 may be configured without a converter.

The SMR 50 is electrically connected to power lines connecting the battery 100 and the PCU 40. When the SMR 50 is closed (that is, in a conductive state) in response to a control signal from the ECU 300, electric power can be exchanged between the battery 100 and the PCU 40. On the other hand, when the SMR 50 is opened (that is, in an interrupted state) in response to a control signal from the ECU 300, electrical connection between the battery 100 and the PCU 40 is interrupted.

The air conditioner 60 is a temperature adjuster that adjusts the temperature of a cabin of the vehicle 1 based on a control signal from the ECU 300. The air conditioner 60 has, for example, a cooling function of sending cooling air into the cabin of the vehicle 1 and a heating function of sending heating air into the cabin. The air conditioner 60 is, for example, able to adjust the temperature of the cabin of the vehicle 1 by sending cooling air or heating air such that the temperature of the cabin becomes a target value set in the ECU 300.

The battery 100 is an electrical storage device that stores electric power for driving the MG 10. The battery 100 is a rechargeable direct-current power supply and is made up of, for example, a plurality of serially connected cells 110. Each cell 110 is a secondary battery, such as a lithium ion secondary battery.

In each of the cells 110 in the present embodiment, various known materials may be used as a positive electrode active material that is a component of a positive electrode, a negative electrode active material that is a component of a negative electrode, and the material of an electrolyte. Examples of the positive electrode active material may include lithium cobaltate ($LiCoO_2$), lithium niccolate ($LiNiO_2$), and lithium nickel manganese cobalt oxide (such as $LiNi_{1/3}Co_{1/3}Mn_{1/3}O_2$ and $LiNi_{0.5}Co_{0.2}Mn_{0.3}O_2$). Examples of the negative electrode active material may include graphite. The electrolyte may be composed of, for example, lithium salt (for example, $LiPF_6$, or the like), an organic solvent (examples of the organic solvent include ethyl methyl carbonate (EMC), dimethyl carbonate (DMC), and ethylene carbonate (EC)), and the like.

Each of the voltage sensors 210 detects a voltage VB between the terminals of a corresponding one of the plurality of cells 110. The current sensor 220 detects a current IB that is input to or output from the battery 100. Each of the temperature sensors 230 detects a temperature TB of a corresponding one of the plurality of cells 110. The sensors output the detected results to the ECU 300.

The ECU 300 includes a central processing unit (CPU) 301, and a memory (including, for example, a read only memory (ROM) and a random access memory (RAM)) 302. The ECU 300 controls various devices based on signals received from the sensors and information such as maps and programs stored in the memory 302 such that the vehicle 1 is placed in a desired state.

The amount of electric power stored in the battery 100 is generally managed by using a state of charge (SOC) that expresses a current amount of electric power stored to a full charge capacity in percentage. The ECU 300 has a function of successively calculating the SOC of the battery 100 based on detected values of the voltage sensors 210, current sensor 220, and temperature sensors 230. Various known techniques may be employed as a method of calculating the SOC. Examples of the various known techniques include a technique through integration of a current value (coulomb count), and a technique through estimation of an open circuit voltage (OCV).

While the vehicle 1 is being driven, the battery 100 is charged with regenerated electric power generated by the MG 10 or discharged by the MG 10 as discharge electric power. The ECU 300 controls the output of the MG 10 (that is, the PCU 40) such that a power for generating the driving force of the vehicle required from a driver (required driving force that is set according to an accelerator operation amount) or the braking force of the vehicle required from the driver (required decelerating force that is set according to a brake pedal depression amount or a vehicle speed) is output from the MG 10.

Each of the cells 110 that make up the battery 100 mounted on the vehicle 1 having the above-described configuration progressively deteriorates as a result of, for example, repetition of charging and discharging. Therefore, the state of deterioration of each of the cells 110 needs to be determined. Therefore, for example, it is conceivable to determine the state of deterioration of each of the cells 110 by changing the SOC of each of the cells 110. When the state of deterioration is determined in this way, the preparation of an environment that allows charging and discharging of the cells 110 is required. Hence, when there is no environment that allows charging and discharging of the cells 110, the state of deterioration of the secondary battery may not be determined. When the cells 110 are charged and discharged for the purpose of determining the state of deterioration of each of the cells 110, an energy loss may occur.

In the present embodiment, the ECU 300 acquires a first open circuit voltage of each cell 110 when the temperature of the cell 110 that is a secondary battery is a first temperature and a second open circuit voltage of each cell 110 when the temperature of the cell 110 is a second temperature to which the temperature of the cell 110 has changed from the first temperature, and estimate the degree of deterioration of each cell 110 by using a difference between a first slope and a second slope. The first slope is represented by the ratio of a voltage change obtained by subtracting the first open circuit voltage from the second open circuit voltage to a temperature change obtained by subtracting the first temperature from the second temperature. The second slope is represented by the ratio of the voltage change to the temperature change when the cell 110 is new and the temperature of the cell 110 has changed from the first temperature to the second temperature. In the present embodiment, the ECU 300 is an example of a controller.

With this configuration, the difference between the first slope and the second slope corresponds to the amount of deviation from an initial value of the capacity, so the degree of deterioration of each cell 110 is accurately estimated by using the calculated difference. Therefore, even when there is no environment that allows charging and discharging of the cells 110, the degree of deterioration of each cell 110 can be accurately estimated.

In the present embodiment, as an example, it is assumed that the degree of deterioration of a secondary battery is quantitatively evaluated by using, for example, a capacity retention rate that is defined by the percentage of a current full charge capacity to a full charge capacity (Ah) of the new secondary battery. It is understood from this definition that the degree of deterioration of a secondary battery decreases as the capacity retention rate increases and the degree of deterioration of a secondary battery increases as the capacity retention rate decreases.

Hereinafter, a change in slope due to deterioration, which is represented by the ratio of a voltage change to a temperature change, will be described with reference to FIG. 2 to FIG. 4.

Figure 2:
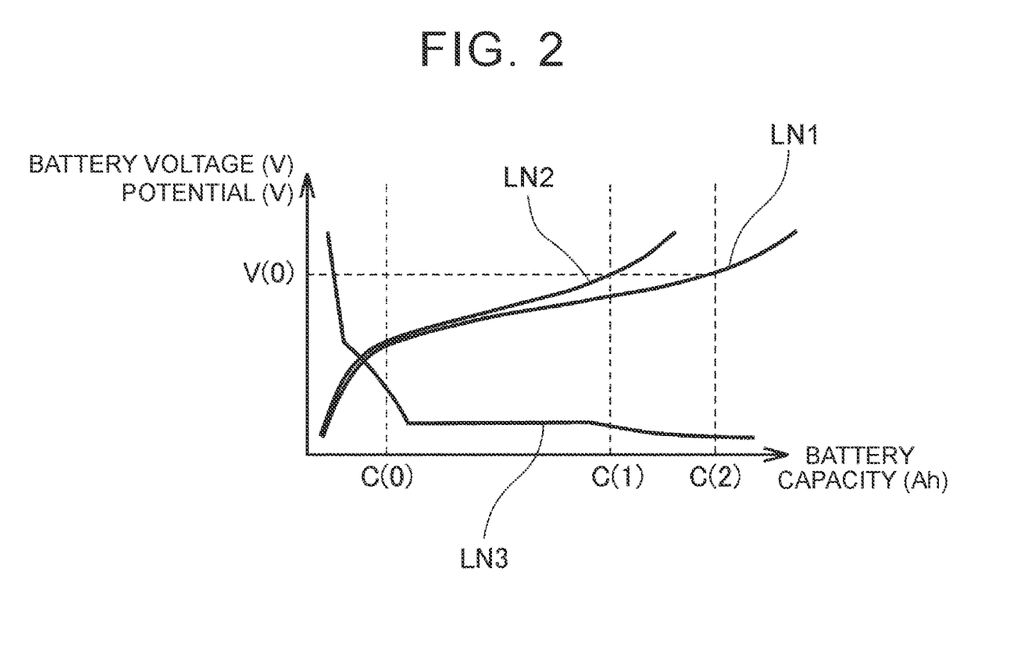
FIG. 2 is a graph that shows an example of the relationship between a battery capacity and each of a new battery voltage, an aged battery voltage, and a negative electrode potential.

FIG. 2 is a graph that shows an example of the relationship between a battery capacity and each of a new battery voltage, an aged battery voltage, and a negative electrode potential. The ordinate axis of FIG. 2 represents a battery voltage or potential (V). The abscissa axis of FIG. 2 represents a battery capacity (Ah). LN1 in FIG. 2 represents the relationship between a battery voltage (OCV) and a battery capacity when the cell 110 is new. LN2 in FIG. 2 represents the relationship between a battery voltage and a battery capacity when the cell 110 is aged. LN3 in FIG. 2 represents the relationship between a negative electrode potential and a battery capacity. In FIG. 2, it is assumed that the battery temperature is, for example, constant at a temperature of T(0).

As represented by LN1 and LN2 in FIG. 2, the relationship between a battery capacity and a battery voltage is such that the battery voltage increases as the battery capacity increases and the battery voltage decreases as the battery capacity decreases. The relationship between a battery capacity and a battery voltage is such that, when the battery capacity falls within a first range greater than a predetermined value C(0), the battery voltage gently decreases with a decrease in battery capacity. The relationship between a battery capacity and a battery voltage is such that, when the battery capacity falls within a second range less than or equal to the predetermined value C(0), the battery voltage decreases with a decrease in battery capacity at a higher rate of decrease than that when the battery capacity falls within the first range. As represented by LN3 in FIG. 2, the negative electrode potential has such characteristics that the negative electrode potential increases as the battery capacity decreases and decreases as the battery capacity increases.

As represented by LN1 to LN3 in FIG. 2, a capacity deviation occurs in each of the positive and negative electrodes after being aged, so LN2 in FIG. 2 is shown as a curve whose battery capacity is reduced to a lower side (left side) as compared to LN1 in FIG. 2 for the new cell 110. As a result, when the battery voltage V(0) is the same as well, the battery capacity reduces from C(2) to C(1). At this time, the relationship between the battery temperature and battery voltage of the cell 110 changes according to deterioration of the cells 110.

Figure 3:
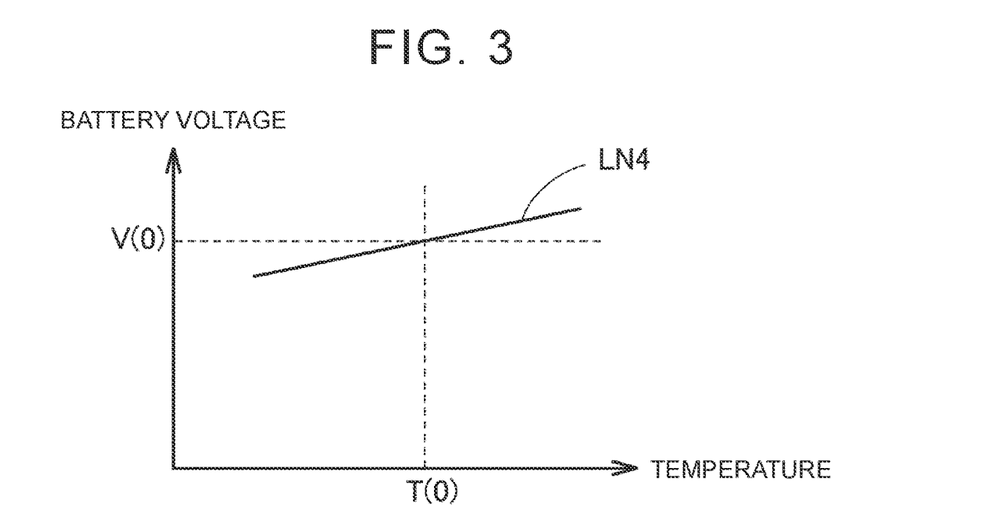
FIG. 3 is a graph that shows an example of the relationship between a battery temperature and a battery voltage when a cell is new.

FIG. 3 is a graph that shows an example of the relationship between a battery temperature and a battery voltage when the cell 110 is new. The ordinate axis of FIG. 3 represents a battery voltage. The abscissa axis of FIG. 3 represents a battery temperature. LN4 in FIG. 3 represents a change in battery voltage with a change in battery temperature. When the cell 110 is new, the relationship between a battery temperature and a battery voltage is such that, as represented by LN4 in FIG. 3, the battery voltage is V(0) at a temperature of T(0), the battery voltage linearly increases because of a change in the entropy of the electrodes with an increase in battery temperature, and the battery voltage linearly decreases with a decrease in battery temperature.

Figure 4:
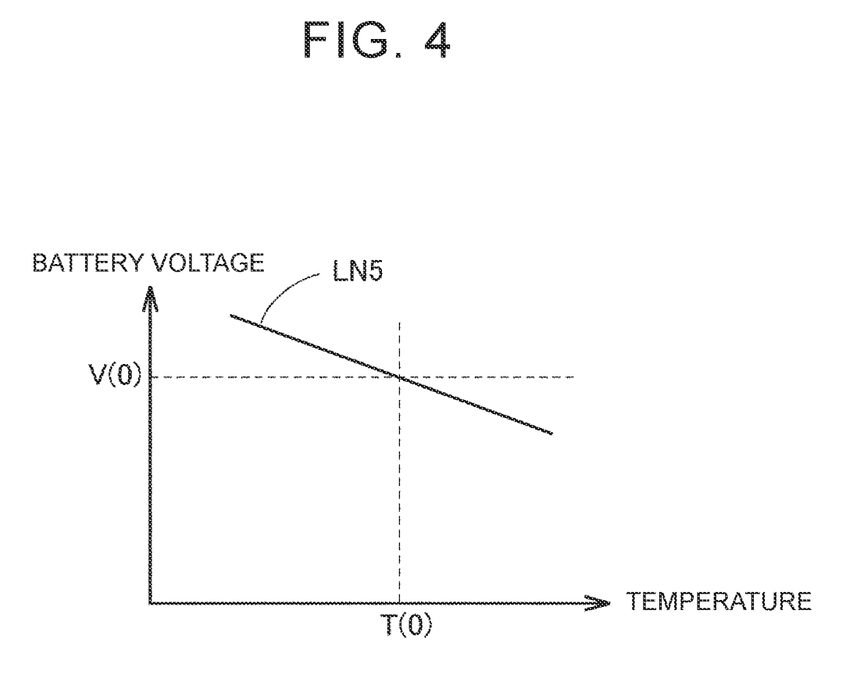
FIG. 4 is a graph that shows an example of the relationship between a battery temperature and a battery voltage when a cell is aged.

FIG. 4 is a graph that shows an example of the relationship between a battery temperature and a battery voltage when the cell 110 is aged. The ordinate axis of FIG. 4 represents a battery voltage. The abscissa axis of FIG. 4 represents a battery temperature. LN5 in FIG. 4 represents a change in battery voltage with a change in battery temperature. When the cell 110 is aged, the relationship between a battery temperature and a battery voltage is such that, as represented by LN5 in FIG. 4, the battery voltage is V(0) at a temperature of T(0), the battery voltage linearly decreases because of a change in the entropy of the electrodes with an increase in battery temperature, and the battery voltage linearly increases with a decrease in battery temperature.

As represented by LN4 in FIG. 3 and LN5 in FIG. 4, the slope of a straight line expressed by the ratio of a voltage change to a temperature change changes (the slope of the straight line reduces) as the cell 110 ages from the state where the cell 110 is new. In other words, the degree of deterioration of the cell 110 is accurately estimated by using the amount of deviation (that is, the difference) from the slope of the straight line (LN4 in FIG. 3) when the cell 110 is new.

In the following description, a slope that is expressed by the ratio of a voltage change to a temperature change based on detected results corresponds to a first slope a1. A slope that is expressed by the ratio of a voltage change to a temperature change when the cell 110 is new corresponds to a second slope a2.

Figure 5:
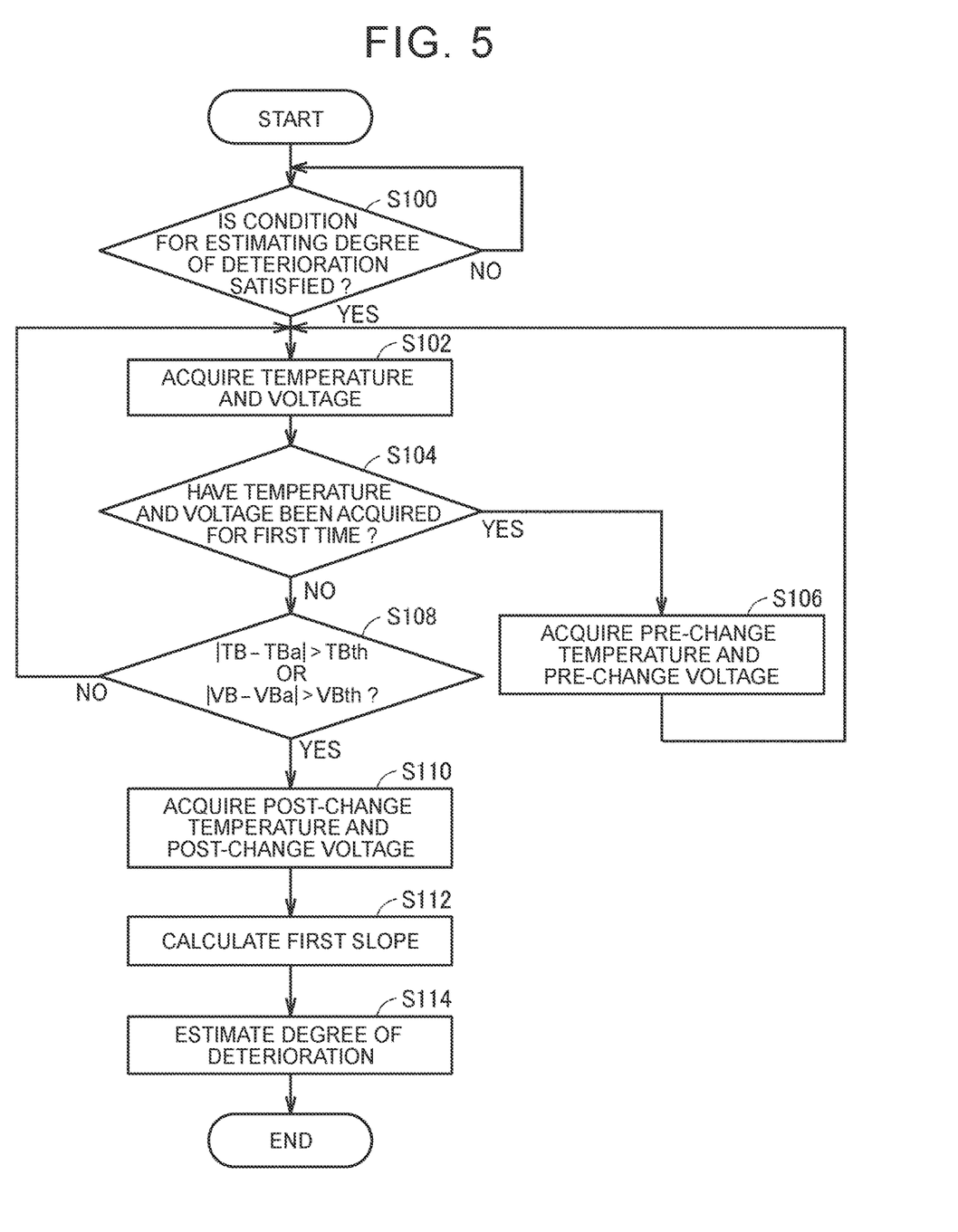
FIG. 5 is a flowchart that shows an example of a process that is executed by an ECU.

Hereinafter, a process that is executed by the ECU 300 will be described with reference to FIG. 5. FIG. 5 is a flowchart that shows an example of the process that is executed by the ECU 300. The control process that is shown in the flowchart is executed by the ECU 300 shown in FIG. 1 each time a predetermined period elapses (for example, a point in time at which the predetermined period elapses from a point in time at which the last process has ended). In the following description, the case where the degree of deterioration of any one of the plurality of cells 110 that make up the battery 100 is estimated will be described as an example. Alternatively, the following process may be executed over each of the plurality of cells 110, and the degree of deterioration of each of the plurality of cells 110 may be estimated.

In step (hereinafter, step is abbreviated as S) 100, the ECU 300 determines whether a condition for estimating a degree of deterioration is satisfied.

The condition for estimating a degree of deterioration includes, for example, a condition that the voltage of the cell 110 is stable. For example, when a predetermined period elapses in a non-energized state and voltage fluctuations per unit time are less than a threshold, the ECU 300 determines that the voltage of the cell 110 is stable and the condition for estimating a degree of deterioration is satisfied.

The ECU 300 determines whether the cell 110 is in a non-energized state (for example, the current is less than the threshold) by using, for example, a detected result of the current sensor 220. Alternatively, the ECU 300 may determine that the cell 110 is in a non-energized state when the SMR 50 is in an interrupted state. The ECU 300 incorporates, for example, a timer, and determines whether the predetermined period has elapsed by using the timer. The ECU 300 acquires voltage fluctuations per unit time by using a detected result of the voltage sensor 210.

When the ECU 300 determines that the condition for estimating a degree of deterioration is satisfied (YES in S100), the process proceeds to S102. When the ECU 300 determines that the condition for estimating a degree of deterioration is not satisfied (NO in S100), the process is returned to S100.

In S102, the ECU 300 acquires the temperature and voltage (OCV) of the cell 110. The ECU 300 acquires the temperature TB and voltage VB of the cell 110 by using, for example, detected results of the voltage sensor 210 and temperature sensor 230.

In S104, the ECU 300 determines whether the temperature TB and voltage VB of the cell 110 have been acquired for the first time. Specifically, the ECU 300 determines whether acquisition of the temperature TB and the voltage VB just before is the first time after the condition is satisfied. When the ECU 300 determines that the temperature TB and the voltage VB have been acquired for the first time (YES in S104), the process proceeds to S106.

In S106, the ECU 300 sets the temperature TB acquired just before as a pre-change temperature TBa, and sets the voltage VB acquired just before as a pre-change voltage VBa. When the ECU 300 determines that the temperature TB and the voltage VB have been acquired not for the first time (NO in S104), the process proceeds to S108.

In S108, the ECU 300 determines whether the absolute value of the difference (|TB−TBa|) between the temperature TB acquired just before and the pre-change temperature TBa is greater than a threshold TBth or the absolute value of the difference (|VB−VBa|) between the voltage VB acquired just before and the pre-change voltage VBa is greater than a threshold VBth. When the ECU 300 determines that |TB−TBa| is greater than the threshold TBth or when the ECU 300 determines that |VB−VBa| is greater than the threshold VBth (YES in S108), the process proceeds to S110.

In S110, the ECU 300 sets the temperature TB acquired just before as a post-change temperature TBb and sets the voltage VB acquired just before as a post-change voltage VBb.

In S112, the ECU 300 calculates the first slope a1. Specifically, the ECU 300 calculates the first slope a1 by using the following mathematical expression.

First slope $a1=(VBb-VBa)/(TBb-TBa)$

In S114, the ECU 300 estimates the degree of deterioration of the cell 110. Specifically, the ECU 300 calculates the second slope a2 associated with the calculated first slope a1. The ECU 300 estimates the degree of deterioration by using the difference between the first slope a1 and the second slope a2.

Figure 6:
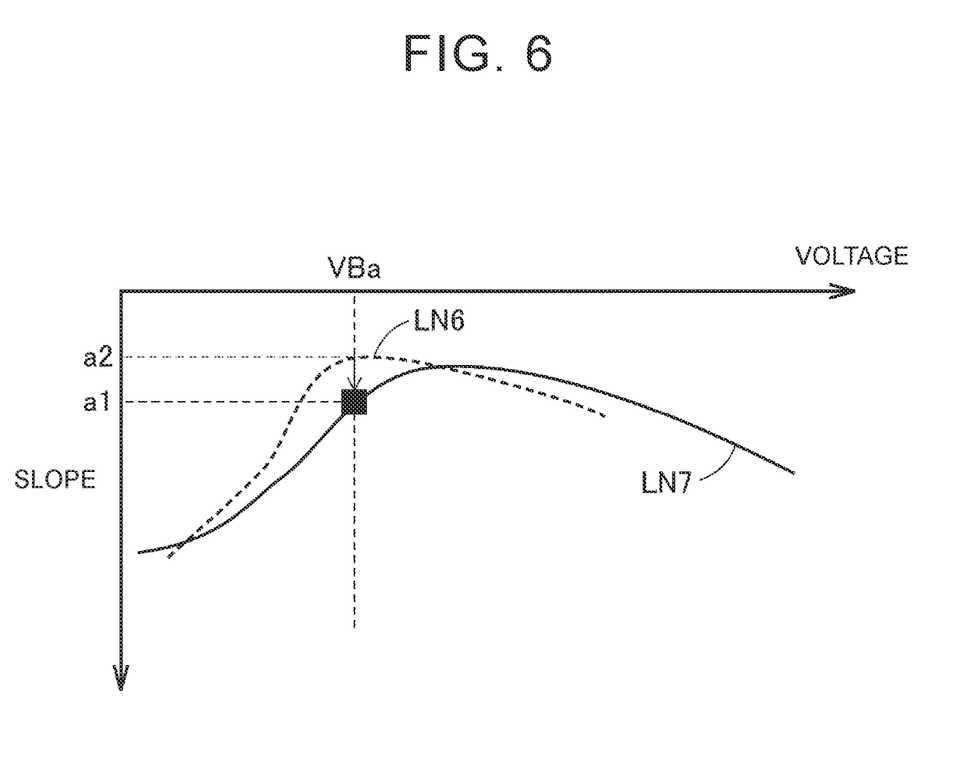
FIG. 6 is a graph that shows an example of the relationship between a voltage and a slope when a cell is new and the relationship between a voltage and a slope when a cell is aged.

FIG. 6 is a graph that shows an example of the relationship between a voltage and a slope when the cell 110 is new and the relationship between a voltage and a slope when the cell 110 is aged. The abscissa axis of FIG. 6 represents a voltage. The ordinate axis of FIG. 6 represents a slope. In FIG. 6, it is assumed that the battery temperature is constant.

LN6 (dashed line) in FIG. 6 represents an example of a change in slope with a change in pre-change voltage VBa when the cell 110 is new. LN7 (continuous line) in FIG. 6 represents an example of a change in slope with a change in pre-change voltage VBa when the cell 110 is aged.

As represented by LN6 and LN7 in FIG. 6, when the cell 110 is aged, the relationship between a voltage and a slope is shown as a curve (LN7 in FIG. 6) to which LN6 in FIG. 6, corresponding to the state where the cell 110 is new, is expanded to a higher voltage side (right side). Therefore, the difference between the first slope a1 and the second slope a2 at the pre-change voltage VBa corresponds to the degree of deterioration of the cell 110.

For this reason, the ECU 300 derives, for example, a curve that is represented by LN6 in FIG. 6, associated with the pre-change temperature TBa. The memory 302 of the ECU 300 stores, for example, a plurality of curves set by experiments, or the like, at predetermined temperature intervals. The ECU 300 derives a curve (LN6 in FIG. 6) associated with the pre-change temperature TBa.

The ECU 300 calculates the second slope a2 from the derived curve and the pre-change voltage VBa. The ECU 300 calculates the difference between the first slope a1 and the second slope a2. The ECU 300 estimates the degree of deterioration of the cell 110 from the calculated difference and the pre-change voltage VBa. The ECU 300 may, for example, calculate an estimated value of the degree of deterioration by multiplying a coefficient by the calculated difference.

As represented by LN6 and LN7 in FIG. 6, the value of the difference between the first slope a1 and the second slope a2 varies depending on the value of the pre-change voltage VBa even in the same state of deterioration. For this reason, the ECU 300 may, for example, set a coefficient by using a predetermined map that represents the relationship between a pre-change voltage VBa and each of a voltage and a coefficient and calculate an estimated value of the degree of deterioration by multiplying the set coefficient by the calculated difference. The predetermined map is, for example, adapted by experiments, or the like, and is prestored in the memory 302 of the ECU 300.

When the ECU 300 determines that |TB−TBa| is less than or equal to the threshold TBth and |VB−VBa| is less than or equal to the threshold VBth (NO in S108), the process is returned to S102.

The operation of the ECU 300 based on the above-described structure and flowchart will be described.

For example, it is assumed that the vehicle 1 is left standing in a parked state. When the predetermined period has elapsed while the cell 110 is in a non-energized state and voltage fluctuations per unit time are less than the threshold, the ECU 300 determines that the voltage of the cell 110 is stable and the condition for estimating a degree of deterioration is satisfied (YES in S100).

At this time, the temperature TB and voltage VB of the cell 110 are acquired (S102). When the temperature TB and the voltage VB have been acquired for the first time after the condition is satisfied (YES in S104), the acquired temperature TB is set as the pre-change temperature TBa, and the acquired voltage VB is set as the pre-change voltage VBa (S106).

The temperature TB and the voltage VB are acquired again (S102). When it is determined that the temperature TB and the voltage VB have been acquired not for the first time (NO in S104), acquisition of the temperature TB and the voltage VB is repeated with time until |TB−TBa| becomes greater than the threshold TBth or |VB−VBa| becomes greater than the threshold VBth (NO in S108).

When the temperature TB or the voltage VB changes with time and |TB−TBa| becomes greater than the threshold TBth or |VB−VBa| becomes greater than the threshold VBth (YES in S108), the temperature TB acquired just before is set as the post-change temperature TBb, and the voltage VB acquired just before is set as the post-change voltage VBb (S110).

The first slope a1 is calculated by using the set pre-change temperature TBa, pre-change voltage VBa, post-change temperature TBb, and post-change voltage VBb (S112). The second slope a2 associated with the calculated first slope a1 is calculated, and the degree of deterioration is estimated by using the difference between the first slope a1 and the second slope a2 (S114).

As described above, with the deterioration estimation device for a secondary battery according to the present embodiment, the difference between the first slope a1 and the second slope a2 corresponds to the amount of deviation from the initial value of the capacity, so the degree of deterioration of the cell 110 can be accurately estimated by using the calculated difference. Therefore, even when there is no environment that allows charging and discharging of the cells 110, the degree of deterioration of each cell 110 can be accurately estimated. In addition, the cells 110 are not charged or discharged, so occurrence of an energy loss due to charging or discharging is reduced. Therefore, a deterioration estimation device for a secondary battery and a deterioration estimation method for a secondary battery, which accurately estimate a degree of deterioration of the secondary battery without charging or discharging, are provided.

Hereinafter, modifications will be described. In the above-described embodiment, the description is made on the assumption that the vehicle 1 is an electric vehicle. Alternatively, the vehicle 1 may be any vehicle equipped with at least a driving rotary electric machine and an electrical storage device that exchanges electric power with the driving rotary electric machine, and is not specifically limited to an electric vehicle. The vehicle 1 may be, for example, a hybrid vehicle (including a plug-in hybrid vehicle) equipped with a driving electric motor and an engine.

In addition, the above-described embodiment describes the configuration in which the vehicle 1 is equipped with a single motor generator as an example. Alternatively, the vehicle 1 may be equipped with a plurality of motor generators. In this case, discharge control may be executed over each of the plurality of motor generators.

Furthermore, the above-described embodiment describes that the degree of deterioration of each of the plurality of cells 110 mounted on the vehicle 1 is estimated. However, since the cells 110 do not need to be charged or discharged, for example, as long as the temperature and the voltage can be measured, the degree of deterioration of each of the plurality of cells 110 can be estimated even in, for example, a state where the cells 110 are not mounted on the vehicle 1.

Figure 7:
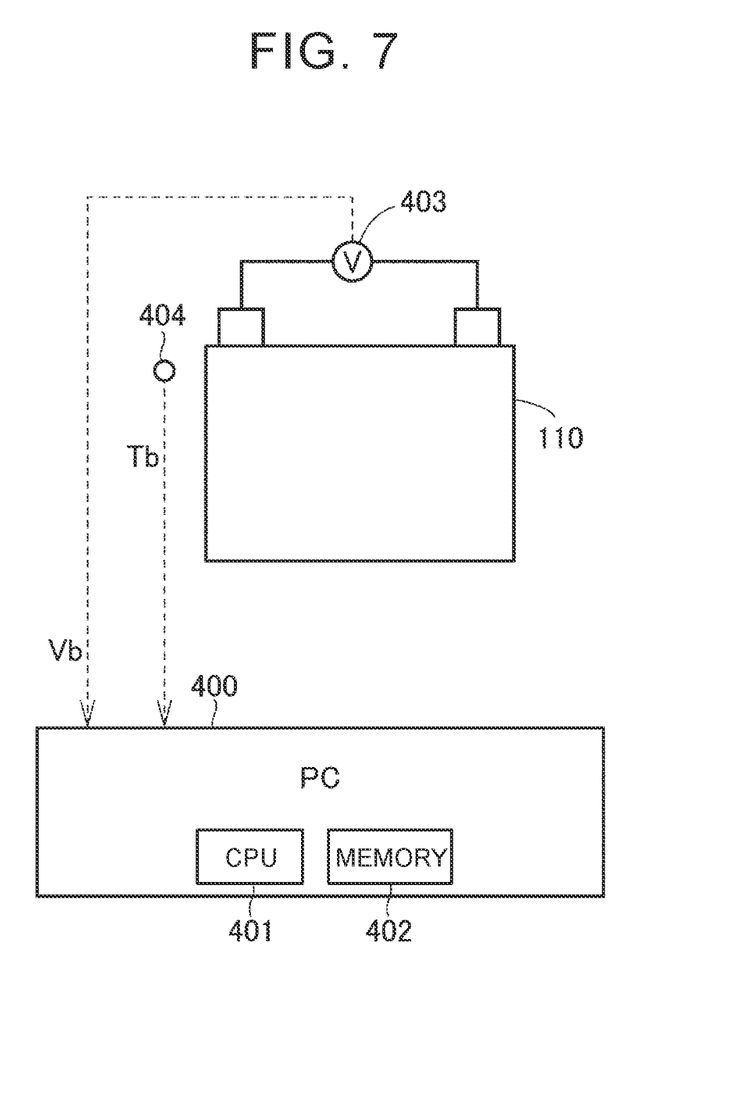
FIG. 7 is a diagram that shows an example of the configuration of a deterioration estimation device for a secondary battery according to a modification.

FIG. 7 is a diagram that shows an example of the configuration of a deterioration estimation device for a secondary battery according to a modification. As shown in FIG. 7, the deterioration estimation device for a secondary battery according to the modification is made up of, for example, a personal computer (PC) 400 including a CPU 401 and a memory 402, a voltage sensor 403 that detects the voltage VB of the cell 110, and a temperature sensor 404 that detects the temperature TB of the cell 110. With this configuration as well, when the PC 400 executes the process executed by the above-described ECU 300, the degree of deterioration of each cell 110 is estimated.

With such a configuration, for example, batteries are collected from a plurality of vehicles, and the degree of deterioration of each of a plurality of cells 110 that make up the plurality of batteries 100 recovered is individually estimated. In addition, to charge or discharge the cells 110, no additional device needs to be mounted on the vehicle, no additional equipment for charging or discharging needs to be prepared, or no movement of the cells 110 to equipment for charging or discharging is required, so estimation of a degree of deterioration can be quickly performed. Furthermore, for example, business operators, such as dealers of vehicles, may collect batteries from a plurality of vehicles, individually estimate a degree of deterioration on a cell-by-cell basis, and resell the batteries as used batteries. Therefore, a low-cost battery resale system can be constructed.

The above-described embodiment describes an example in which, after a first temperature (pre-change temperature) is acquired, the cell 110 is left standing until the temperature of the cell 110 changes from the first temperature to a second temperature (post-change temperature) as an example. Alternatively, for example, the temperature of the cell 110 may be adjusted to at least any one of the first temperature and the second temperature by using the air conditioner 60. For example, the temperature of the cell 110 may be changed to a predetermined first temperature and the first open circuit voltage may be acquired, and then the temperature of the cell 110 may be changed to the second temperature and the second open circuit voltage may be acquired. Alternatively, the current temperature of the cell 110 may be set to the first temperature and then the first open circuit voltage may be acquired, and the temperature of the cell 110 may be changed to the second temperature and then the second open circuit voltage may be acquired. Alternatively, when the deterioration estimation device for a secondary battery is not mounted on the vehicle, the temperature of each cell 110 may be adjusted to at least any one of the first temperature and the second temperature by using a temperature-adjustable thermostatic chamber.

With this configuration, when the temperature of the cell 110 is adjusted to at least any one of the first temperature and the second temperature by using a temperature-adjustable air conditioner or thermostatic chamber, at least any one of the pre-change voltage VBa and the post-change voltage VBb is acquired. Therefore, for example, in comparison with the case where the open circuit voltage at the second temperature to which the temperature has changed from the first temperature as a result of standing, or the like, is acquired, the open circuit voltage can be quickly acquired.

The above-described embodiment describes that a degree of deterioration is estimated by using the difference between a first slope a1 and a second slope a2. Alternatively, for example, in addition to estimation of a degree of deterioration using the difference between a first slope a1 and a second slope a2, abnormal deterioration, such as precipitation of lithium, may be detected. This is because abnormal deterioration, such as precipitation of lithium, can also occur because of a capacity deviation between the positive and negative electrodes. The ECU 300 may determine that abnormal deterioration, such as precipitation of lithium, is occurring, for example, when the amount of increase in degree of deterioration per predetermined period exceeds a threshold or when the magnitude of the difference exceeds a threshold.

The above-described embodiment describes that a degree of deterioration is estimated by using the difference between a first slope a1 and a second slope a2. Alternatively, for example, the degree of deterioration may be estimated by using a first slope a1 and a predetermined map between a first slope a1 and a degree of deterioration.

Figure 8:
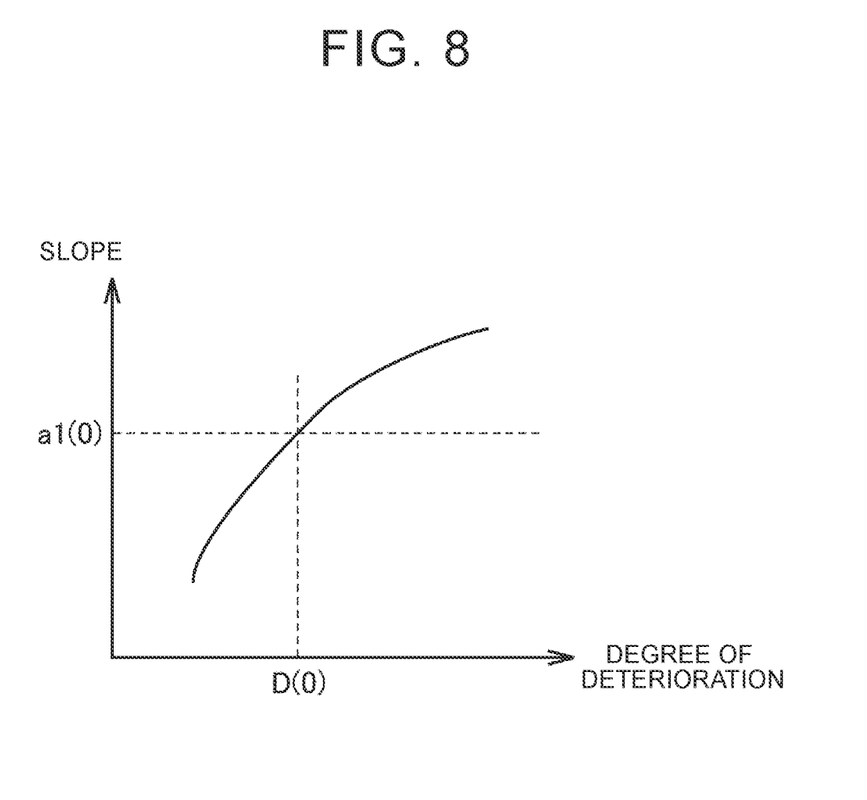
FIG. 8 is a graph that shows the relationship between a degree of deterioration and a first slope.

FIG. 8 is a graph that shows the relationship between a degree of deterioration and a first slope. As shown in FIG. 8, the relationship between a degree of deterioration and a first slope is such that, when the voltage is constant, the slope increases as the degree of deterioration increases. The memory of the ECU 300 stores a plurality of predetermined maps that represent the relationship between a degree of deterioration and a first slope a1 as shown in FIG. 8 at predetermined voltage intervals. The ECU 300, for example, derives the predetermined map that represents the relationship between a degree of deterioration and a first slope a1, associated with the pre-change voltage VBa (or post-change voltage VBb), and calculates a degree of deterioration from the calculated first slope a1 and the derived predetermined map. For example, when the first slope is a1(0), the ECU 300 calculates an estimated value D(0) of the degree of deterioration by using the predetermined map.

The relationship between a degree of deterioration and a first slope a1 is set by using the difference between a first slope a1 and a second slope a2 that is derived from the first slope a1 and a pre-change voltage VBa (or post-change voltage VBb). With this configuration as well, the degree of deterioration of a secondary battery can be accurately estimated without charging or discharging of the secondary battery.

The above-described embodiment describes that the ECU 300 derives a curve (LN6 in FIG. 6) associated with a pre-change temperature TBa and calculates a second slope a2 from the derived curve and a pre-change voltage VBa. Alternatively, the ECU 300 may, for example, derive a curve associated with a post-change temperature TBb and calculate a second slope a2 from the derived curve and a post-change voltage VBb.

Part or all of the described modifications may be implemented in combination as needed. The embodiment described above is illustrative and not restrictive in all respects. The scope of the disclosure is not defined by the above description, and is defined by the appended claims. The scope of the disclosure is intended to encompass all modifications within the scope of the appended claims and equivalents thereof.

What is claimed is:

1. A deterioration estimation device for a secondary battery, the deterioration estimation device comprising a controller configured to:
   acquire a first open circuit voltage of the secondary battery when a temperature of the secondary battery is a first temperature and a second open circuit voltage of the secondary battery when the temperature of the secondary battery is a second temperature to which the temperature of the secondary battery has changed from the first temperature; and
   estimate a degree of deterioration of the secondary battery by using a difference between a first slope and a second slope, the first slope being represented by a ratio of a voltage change obtained by subtracting the first open circuit voltage from the second open circuit voltage to a temperature change obtained by subtracting the first temperature from the second temperature, the second slope being represented by a ratio of the voltage change to the temperature change when the secondary battery is new and the temperature of the secondary battery has changed from the first temperature to the second temperature.

2. The deterioration estimation device according to claim 1, further comprising a temperature adjuster configured to adjust the temperature of the secondary battery,
   wherein the controller is configured to, when the temperature of the secondary battery is adjusted to at least one of the first temperature and the second temperature by using the temperature adjuster, acquire an open circuit voltage corresponding to the adjusted temperature.

3. A deterioration estimation method for a secondary battery, the deterioration estimation method comprising:
   acquiring a first open circuit voltage of the secondary battery when a temperature of the secondary battery is a first temperature and a second open circuit voltage of the secondary battery when the temperature of the secondary battery is a second temperature to which the temperature of the secondary battery has changed from the first temperature; and estimating a degree of deterioration of the secondary battery by using a difference between a first slope and a second slope, the first slope being represented by a ratio of a voltage change obtained by subtracting the first open circuit voltage from the second open circuit voltage to a temperature change obtained by subtracting the first temperature from the second temperature, the second slope being represented by a ratio of the voltage change to the temperature change when the secondary battery is new and the temperature of the secondary battery has changed from the first temperature to the second temperature.

\* \* \* \* \*